United States Patent
Hasegawa et al.

(10) Patent No.: US 10,566,307 B2
(45) Date of Patent: Feb. 18, 2020

(54) MANUFACTURING METHOD OF SEMICONDUCTOR DEVICE

(71) Applicant: SHINKAWA LTD., Tokyo (JP)

(72) Inventors: Yuu Hasegawa, Tokyo (JP); Naoki Sekine, Tokyo (JP); Yoshihito Hagiwara, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 15/773,169

(22) PCT Filed: Nov. 2, 2016

(86) PCT No.: PCT/JP2016/082698
§ 371 (c)(1),
(2) Date: May 3, 2018

(87) PCT Pub. No.: WO2017/078109
PCT Pub. Date: May 11, 2017

(65) Prior Publication Data
US 2018/0323166 A1 Nov. 8, 2018

(30) Foreign Application Priority Data
Nov. 5, 2015 (JP) ................................. 2015-217215

(51) Int. Cl.
*H01L 21/00* (2006.01)
*H01L 23/00* (2006.01)
*H01L 23/66* (2006.01)

(52) U.S. Cl.
CPC .............. *H01L 24/78* (2013.01); *H01L 23/66* (2013.01); *H01L 24/48* (2013.01); *H01L 24/85* (2013.01);

(Continued)

(58) Field of Classification Search
None
See application file for complete search history.

(56) References Cited

U.S. PATENT DOCUMENTS

| 5,421,503 A | 6/1995 | Perlberg et al. |
| 2008/0014678 A1* | 1/2008 | Howard ................ H01L 21/565 438/106 |
| 2016/0035695 A1 | 2/2016 | Kumamoto et al. |

FOREIGN PATENT DOCUMENTS

| JP | S5919341 | 1/1984 |
| JP | 2008-533899 | 8/2008 |

(Continued)

OTHER PUBLICATIONS

"International Search Report (Form PCT/ISA/210)" of PCT/JP2016/082698, dated Jan. 31, 2017, with English translation thereof, pp. 1-3.

*Primary Examiner* — Reema Patel
(74) *Attorney, Agent, or Firm* — JCIPRNET (57) ABSTRACT

The disclosure includes: a first lifting step for bonding a wire at a first position (13) with a capillary and for lifting the capillary up to a first height H1 while feeding the wire; a circular arc lifting step for carrying out a circular arc motion for moving the capillary in a circular arc toward a second position (14) by a first distance (L5), and then carrying out a lifting motion for lifting the capillary while feeding the wire; a circular arc motion step for moving the capillary in a circular arc toward the first position (13) by a second distance (L3+L4); a second lifting step for lifting the capillary up to a second height H4; and a looping step for looping the capillary to the second position (14), thereby forming a wire loop having a predetermined height on a substrate by bonding the wire at the second position (14).

3 Claims, 6 Drawing Sheets (52) U.S. Cl.
CPC .............. *H01L 2224/45144* (2013.01); *H01L 2224/48091* (2013.01); *H01L 2224/78301* (2013.01); *H01L 2224/78307* (2013.01); *H01L 2224/78822* (2013.01); *H01L 2224/85* (2013.01); *H01L 2924/19107* (2013.01)

(56) References Cited

FOREIGN PATENT DOCUMENTS

| | | |
|---|---|---|
| JP | 2011018843 | 1/2011 |
| JP | 5714195 | 5/2015 |
| WO | 2006097893 | 9/2006 |

* cited by examiner

MANUFACTURING METHOD OF SEMICONDUCTOR DEVICE

CROSS-REFERENCE TO RELATED APPLICATION

This application is a 371 application of the International PCT application serial no. PCT/JP2016/082698, filed on Nov. 2, 2016, which claims the priority benefits of Japan Patent Application No. 2015-217215, filed on Nov. 5, 2015. The entirety of each of the above-mentioned patent application is hereby incorporated by reference herein and made a part of this specification.

BACKGROUND

1. Field of the Disclosure

The disclosure relates to a semiconductor device with a high wire loop and a method for manufacturing the same.

2. Description of Related Art

A wire bonding apparatus which connects an electrode of a semiconductor chip to an electrode of a substrate with a wire such as a gold wire is commonly used. In the wire bonding apparatus, a capillary is used as a bonding tool which presses and bonds the wire to the electrode. In recent years, in order to cope with a fine pitch of the semiconductor, a bottleneck-shaped (stepped-cone-shaped) capillary with an extending fine front end is used. The bottleneck-shaped capillary has a shape for which a height of the extending fine part (front part) of front end is higher than a height of the formed wire, and the bonding may also be properly performed even when a gap with an adjacent wire is narrow (for example, see FIG. 4 in patent literature 1).

In contrast, a high-frequency power device which connects a RF transistor, an output compensation circuit and a pre-matching circuit by a wire loop is used. With regard to such a high-frequency power device, a method is proposed to optimize properties of the high-frequency power device by a mutual induction coupling between a resistance of the wire loop and a resistance of other wire loops connected to the pre-matching circuit as well as a stray capacitance (for example, see patent literature 2).

LITERATURE OF PRIOR ART

Patent Literature

Patent literature 1: U.S. Pat. No. 5,421,503
Patent literature 2: Japanese Laid-open No. 2008-533899

SUMMARY

Problems to be Solved by the Disclosure

Incidentally, in recent years, a method is used in the high-frequency device, which adjusts a resistance of a wire loop and stabilizes frequency properties of the high-frequency device by increasing a height and a length of the wire loop. Such a wire loop used in the high-frequency device is higher than a height of an extending fine part (front part) of a front end of a capillary, and has a problem that during the wire bonding, the capillary may contact with a wire being bonded or an adjacent wire already bonded, and the shape of the loop is not stable.

Therefore, the disclosure aims to form a wire loop with an increased height by the capillary in a stable manner.

Means to Solve the Problems

A manufacturing method of a semiconductor device of the disclosure includes: a first lifting step for bonding a wire at a first position on a substrate by a capillary and for lifting the capillary up to a first height while feeding the wire from the capillary; a circular arc lifting step for carrying out a circular arc motion for moving the capillary in a circular arc in a direction toward a second position on the substrate that is spaced apart from the first position by a first distance, and then carrying out a lifting motion for lifting the capillary while feeding the wire from the capillary to apply a bending habit to the wire; a circular arc motion step for moving the capillary in a circular arc in a direction toward the first position by a second distance longer than the first distance; a second lifting step for lifting the capillary up to a second height higher than the first height while feeding the wire from the capillary; and a looping step for looping the capillary to the second position; by bonding the wire at the second position, a wire loop having a predetermined height is formed on the substrate.

In the manufacturing method of a semiconductor device of the disclosure, the circular arc lifting step is preferably carried out for several times.

In the manufacturing method of a semiconductor device of the disclosure, it is preferable that the capillary is a stepped cone shape having a tapered elementary part and a front part thinner than the elementary part, the wire loop is a mountain shape whose height from the substrate is higher than a length of the front part of the capillary, an angle of a sloping part on the second position side of the wire loop with respect to an imaginary perpendicular line of the substrate is larger than a spread angle of an external surface of the elementary part with respect to a central axis of the capillary, the first height is 60-90% of the height of the wire loop, the first distance is 50-80% of the height of the wire loop, the second distance is 110-130% of the height of the wire loop, and the second height is 160-210% of the height of the wire loop.

The semiconductor device of the disclosure is a semiconductor device having a mountain-shaped wire loop with a predetermined height which connects between a first position on a substrate to a second position on the substrate that is spaced apart from the first position by a first distance, including: a first junction, which is formed by bonding a wire at the first position by a capillary; a top, which is formed, after forming the first junction, by lifting the capillary up to a first height while feeding the wire from the capillary, then carrying out a circular arc motion for moving the capillary in a circular arc from the first position toward a direction of a second position, then carrying out a lifting motion for lifting the capillary while feeding the wire from the capillary, then moving the capillary in a circular arc toward the direction of the first position by a second distance longer than the first distance, then lifting up the capillary to a second height higher than the first height while feeding the wire from the capillary, and then looping the capillary to a second position; and a second junction, which is formed by bonding the wire at the second position.

The semiconductor device of the disclosure is preferably formed by carrying out, for several times, the circular arc motion for moving the capillary in a circular arc from the first position toward a direction of the second position and the lifting motion for lifting the capillary while feeding the wire from the capillary after the circular arc motion.

In the semiconductor device of the disclosure, it is preferable that the capillary is a stepped cone shape having a tapered elementary part and a front part thinner than the elementary part, the wire loop is a mountain shape whose height from the substrate is higher than a length of the front part of the capillary, an angle of a sloping part on the second position side of the wire loop with respect to an imaginary perpendicular line of the substrate is larger than a spread angle of an external surface of the elementary part with respect to a central axis of the capillary, the first height is 60-90% of the height of the wire loop, the first distance is 50-80% of the height of the wire loop, the second distance is 110-130% of the height of the wire loop, and the second height is 160-210% of the height of the wire loop.

Effect of the Disclosure

The disclosure can form a wire loop with an increased height by the capillary in a stable manner.

DESCRIPTION OF THE EMBODIMENTS

In the following part, a wire bonding method of an embodiment of the disclosure is described with reference to the drawings. First, a capillary 20 used in the wire bonding method of the embodiment and a wire loop 30 formed are described with reference to FIG. 1.

Figure 1:
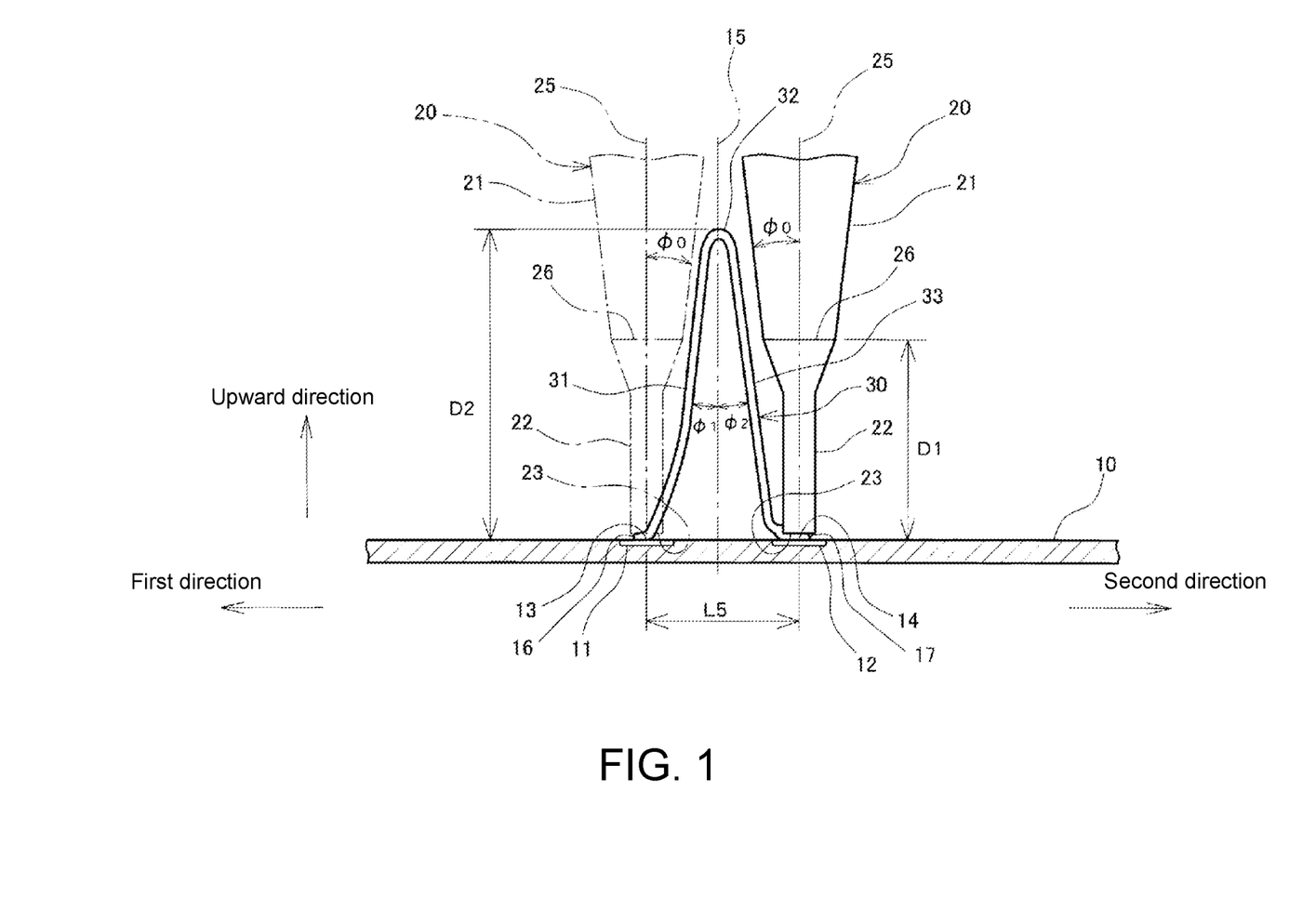
FIG. 1 is an elevation view showing a wire loop and a capillary bonded by a wire bonding method of an embodiment of the disclosure.

As shown in FIG. 1, the capillary 20 is a stepped cone shape having a tapered elementary part 21 and a front part 22 thinner than the elementary part 21. A corner part 26 is formed between the elementary part 21 and the front part 22, and in FIG. 1, the elementary part 21 is above the corner part 26, and the front part 22 is below the corner part 26. Accordingly, a length of the front part 22 is a length D1 shown in FIG. 1.

A hole is formed in the elementary part 21 and the front part 22 for inserting the wire, and the capillary 20 approaches to and separates from a substrate 10 in a vertical direction and moves in a horizontal direction by a bonding head of a wire bonding apparatus which is not shown, bonding a wire extending from a front end 23 of the front part 22 to the substrate 10 to form a wire loop 30. A spread angle of an external surface of the elementary part 21 with respect to a central axis 25 is angle φ0. In addition, angle φ0 is in a range of 5° to 15°, more preferably in a range of 6°-8°.

In addition, in FIG. 1, a one-dot chain line represents the capillary 20 at the starting of the formation of the wire loop 30, a solid line represents a position of the capillary 20 at the end of the formation of the wire loop 30, and a central axis 25 of the capillary 20 is located on the same surface with a perpendicular surface including the wire loop 30. Besides, in FIG. 1, a direction heading from a second position 14 toward a first position 13 is set as a first direction, and a direction heading from the first position 13 toward the second position 14 is set as a second direction. The same is true with other drawings.

The wire loop 30 shown in FIG. 1 forms a mountain shape which connects between a first electrode 11 formed on the substrate 10 to a second electrode 12 which is formed on the substrate 10 and is spaced apart from the first electrode 11 by a distance L5 by the wire. The wire loop 30 includes a first junction 16 formed on the first electrode 11, a first sloping part 31 on the first electrode side, a second sloping part 33 on a second electrode side, a top 32, and a second junction 17 formed on a second electrode 12. A height of the top 32 from the substrate 10 (the height of the wire loop 30) is D2 which is higher than the length D1 of the front part 22 of the capillary 20. In addition, the height D2 of the wire loop 30 is within a range of 500 μm-3000 μm, more preferably within a range of 700 μm-1600 μm.

Here, a center of the first electrode 11 is the first position 13 where the central axis 25 of the capillary 20 arrives when bonding the wire to the first electrode 11, and a center of the second electrode 12 is the second position 14 where the central axis 25 of the capillary 20 arrives when bonding the wire to the second electrode 12. Similarly to the first electrode 11 and the second electrode 12, a gap between the first position 13 and the second position 14 is the distance L5, and the distance L5 is a length of 50-80% of the height D2 of the wire loop 30. In addition, a ratio of the distance L5 to the height D2 of the wire loop 30 is 50%, 55%, 60%, 65%, 70%, 75% and 80% in particular, and may be within a range between any two of these ratios.

An angle of the first sloping part 31 with respect to an imaginary perpendicular line 15 perpendicular to the surface of the substrate 10 is an angle φ1, and an angle of the second sloping part 33 with respect to the imaginary perpendicular line 15 is an angle φ2. Both the angle φ1 and the angle φ2 are greater than the angle φ0 of the elementary part 21 of the capillary 20. In addition, in the embodiment, φ1 and φ2 are approximately of the same greatness, and φ1 and φ2 may also be different from each other as long as they are greater than the angle φ0 of the elementary part 21. The angle φ1 and the angle φ2 are within a range of 10°-40°, and more preferably within a range of 15°-30°.

When the capillary 20 is at the position represented by the one-dot chain line in FIG. 1, the wire loop 30 has not been formed yet, so that the gap between the capillary 20 and the wire loop 30 does not matter. In contrast, as shown by the solid line in FIG. 1, when the front end 23 of the capillary 20 descends down to the surface of the second electrode 12 to bond the wire to the second electrode 12 and the formation of the wire loop 30 is finished, the distance between the wire loop 30 and the surface of the capillary 20 is the shortest. In this case, the angle φ0 of the elementary part 21 of the capillary 20 represented by the solid line in FIG. 1 is still smaller than the angle φ2 of the second sloping part 33 of the wire loop 30. For this reason, even when the formation of the wire loop 30 is finished, the surface of the elementary part 21 still does not contact with the second sloping part 33, and a small gap exists.

Figure 2:
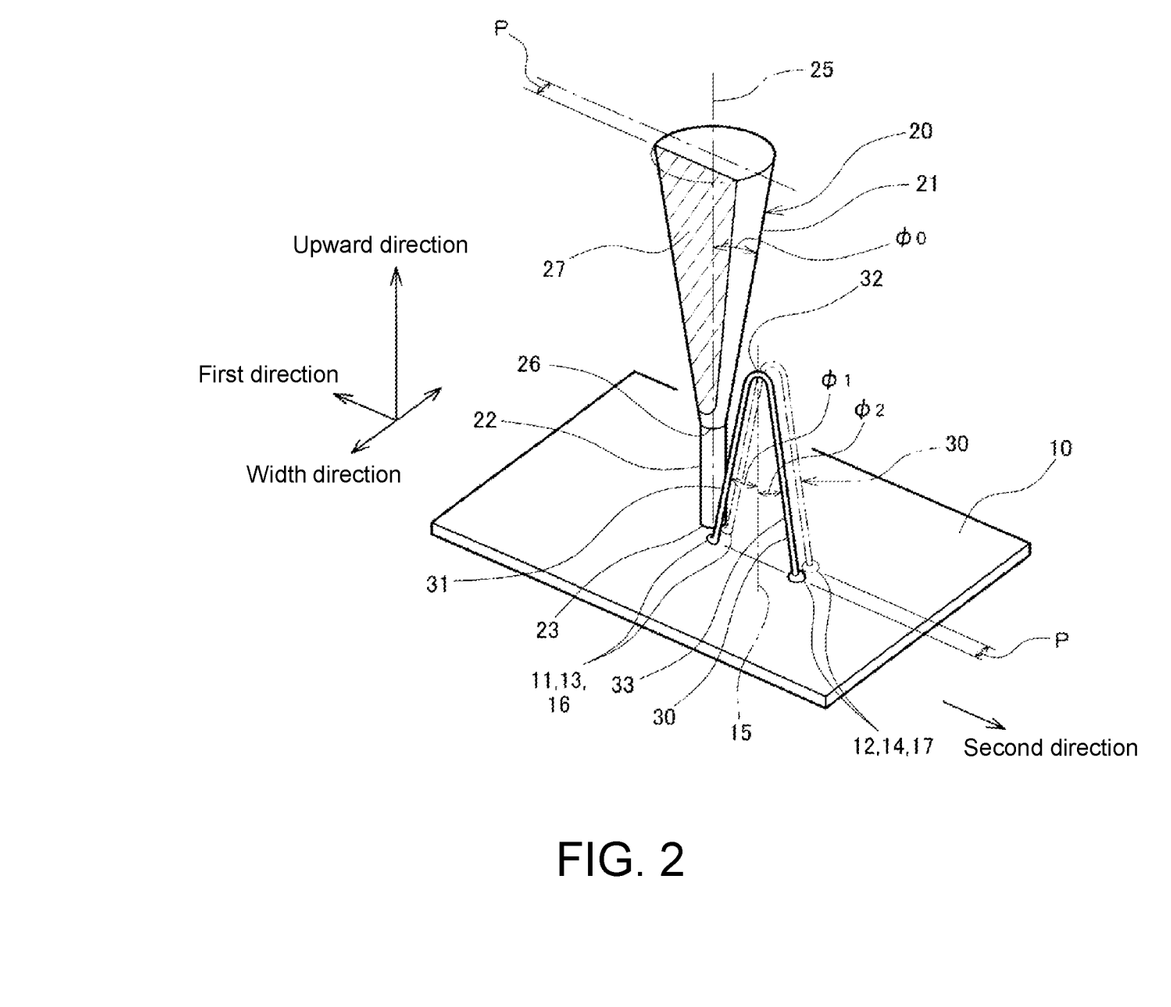
FIG. 2 is a perspective view showing a wire loop and a capillary bonded by a wire bonding method of an embodiment of the disclosure.

As show in FIG. 2, several wire loops 30 are formed in parallel in a width direction with a narrow pitch P. In FIG. 2, the wire loop 30 represented by the solid line represents the wire loop 30 at the end of the bonding, and the one-dot chain line represents the wire loop 30 to which the bonding is about to be performed. The capillary 20 in FIG. 2 is in a state in which the bonding of the wire loop 30 represented by the solid line is finished and the bonding of the next wire loop 30 represented by the one-dot chain line is started. The central axis 25 of the capillary 20 is above the first electrode 11 of the wire loop 30 represented by the one-dot chain line, and the front end 23 presses the wire to the first electrode 11. Accordingly, the central axis 25 of the capillary 20 deviates from the perpendicular surface including the wire loop 30 represented by the solid line in the width direction by the pitch P.

In FIG. 2, a hatching part 27 of the capillary 20 represents a section when the capillary 20 is cut by the perpendicular surface including the wire loop 30 represented by the solid line. As shown in FIG. 2, the first sloping part 31 of the wire loop 30 represented by the solid line is separated from the hatching part 27 of the capillary 20. For this reason, when the bonding of the wire loop 30 represented by the one-dot chain line is started, the capillary 20 does not contact with an adjacent wire loop 30 represented by the solid line whose bonding is finished.

As described above, when the capillary 20 shown in FIGS. 1 and 2 is used to form the wire loop 30 having a shape shown in FIGS. 1 and 2, at the end of the bonding, the surface of the capillary 20 does not contact with the already bonded wire loop 30, and at the beginning of the bonding, the surface of the capillary 20 does not contact with the adjacent wire loop 30 whose bonding is finished.

Figure 3:
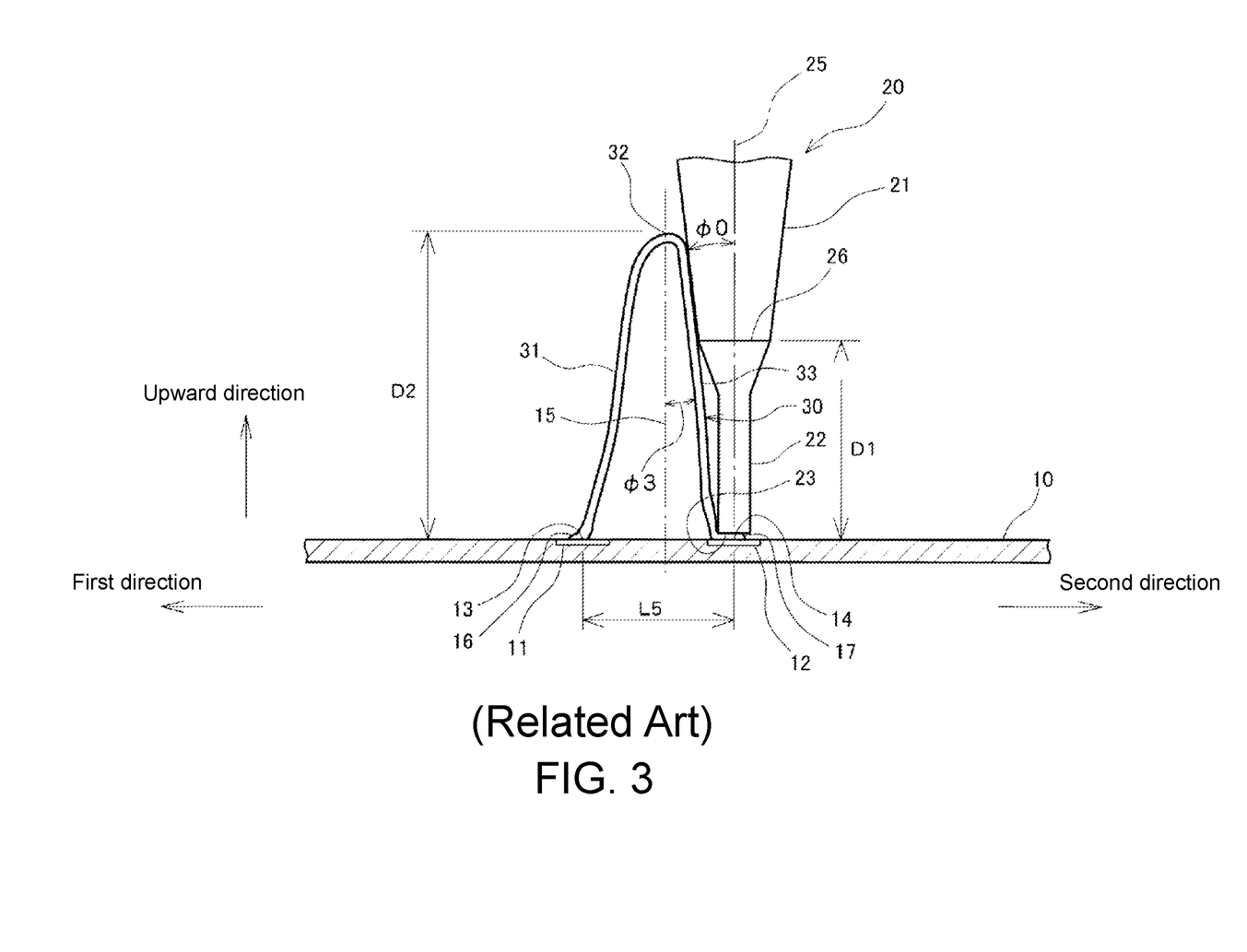
FIG. 3 is an elevation view showing a wire loop and a capillary bonded by a wire bonding method of prior art.
Figure 4:
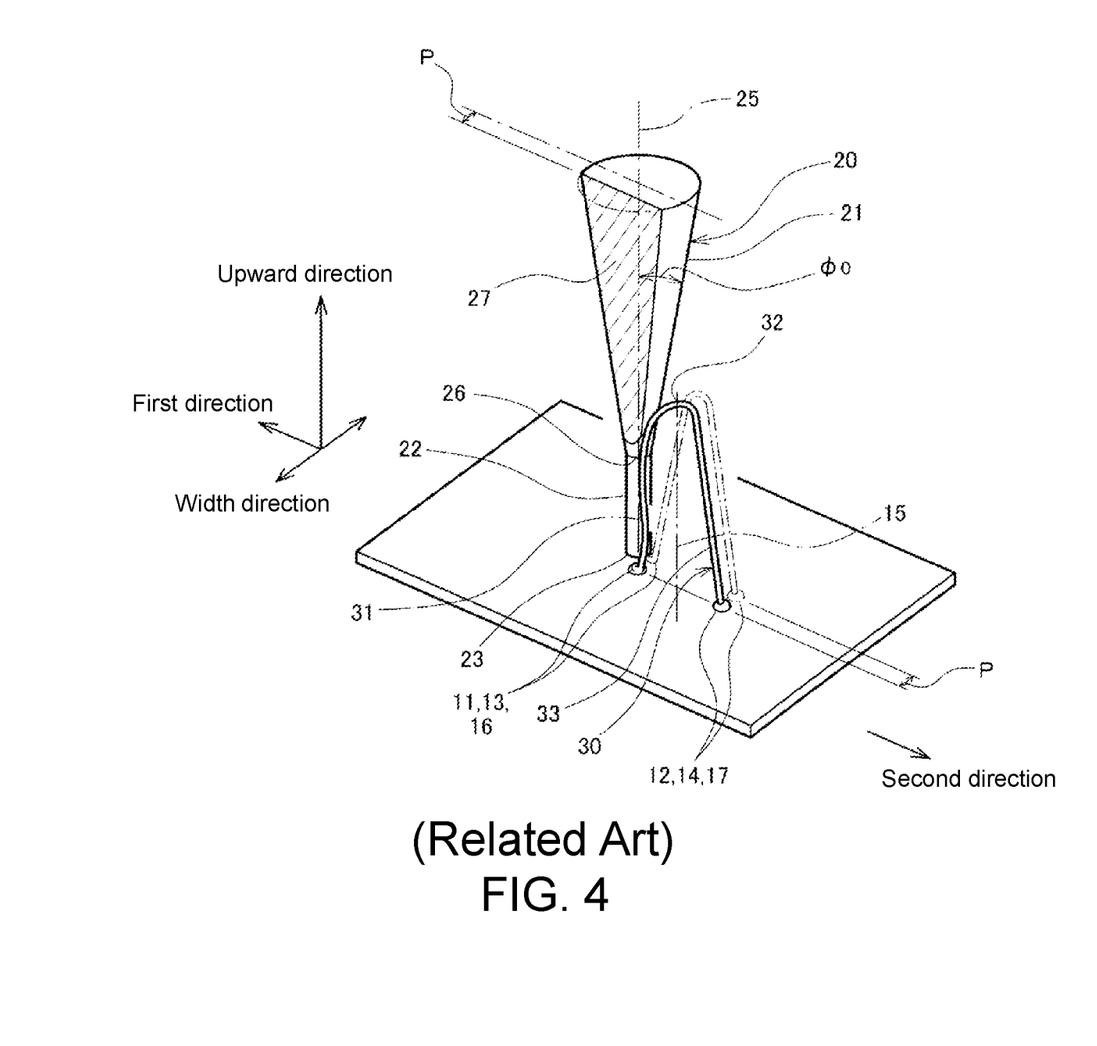
FIG. 4 is a perspective view showing a wire loop and a capillary bonded by a wire bonding method of prior art.

In contrast, if the height D2 of the wire loop 30 increases, the length of the wire loop 30 also increases; accordingly, the wire loop 30 may lean toward a second direction for example as shown in FIG. 3 due to the operating method of the capillary 20. For this reason, an angle φ3 of the second sloping part 33 with respect to the imaginary perpendicular line 15 is smaller than the angle φ0 of the elementary part 21 of the capillary 20, and the surface of the elementary part 21 of the capillary 20 contacts with the second sloping part 33 at the end of the bonding. Besides, when the wire loop 30 has a shape that bulges toward the first direction as shown in FIG. 4, at the beginning of the bonding of the next wire loop 30 represented by the one-dot chain line, the surface of the elementary part 21 of the capillary 20 contacts with the first sloping part 31 of the adjacent wire loop 30 whose bonding is finished. For this reason, when forming the wire loop 30 having an increased height D2 in parallel with the narrow pitch P, it is necessary to move the front end 23 of the capillary 20 so that the shape of the wire loop 30 is stabilized and becomes the shape shown in FIGS. 1 and 2.

Figure 5:
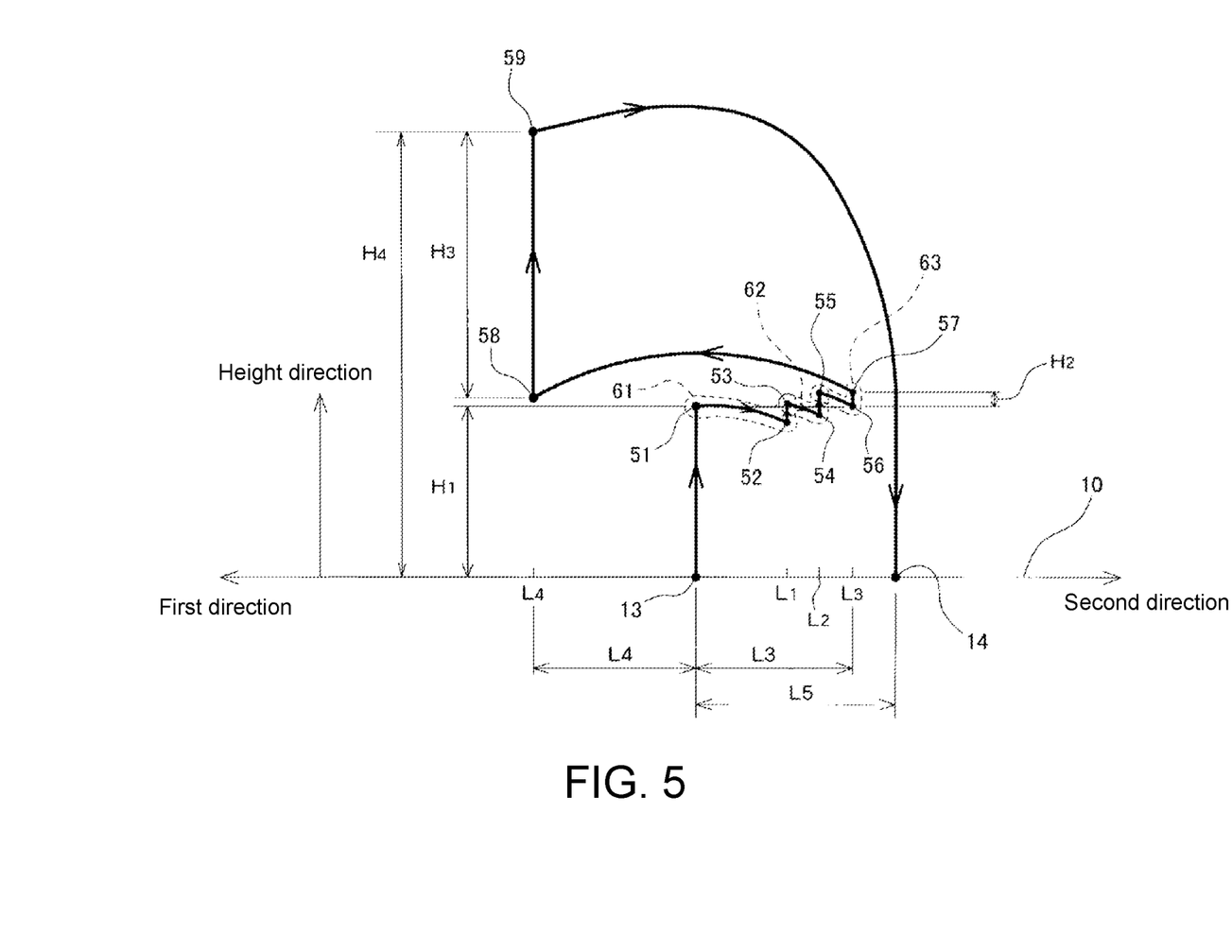
FIG. 5 is a locus chart showing a motion of a front end of a capillary of an embodiment the disclosure.

Accordingly, in the embodiment, the bonding head is driven by the control part of the wire bonding apparatus (a semiconductor manufacturing apparatus) to move the front end 23 of the capillary 20 with a special locus as shown in FIG. 5, by which the shape of the wire loop 30 is stabilized and becomes the shape shown in FIGS. 1 and 2. The control part is a computer which includes a CPU, an operation program, operation data and the like inside. In the following part, the special moving locus of the front end 23 of the capillary 20 is described with reference to FIG. 5. In addition, in FIG. 5, L1 to L5 means a distance from the first position 13.

As shown in FIG. 5, after bonding the wire at the first position 13 of the substrate 10 by the front end 23 to form the first junction 16, the control part lifts the front end 23 up to a point 51 while feeding the wire from the front end 23 (a first lifting step). A height H1 of the point 51 (a first height) is a height of 60-90% of the height D2 of the wire loop 30. In addition, a ratio of the height H1 of the point 51 to the height D2 of the wire loop 30 is 60%, 65%, 70%, 75%, 80%, 85%, and 90% in particular, and may be within a range between any two of these ratios.

Next, the control part carries out a first circular arc lifting step 61 which moves the front end 23 in a circular arc from the point 51 toward the second direction with a circular arc to a point 52, and then lifts the front end 23 to a point 53 while feeding the wire from the front end 23. Next, a second circular arc lifting step 62 is carried out which moves the front end 23 in a circular arc from a point 53 toward the second direction with a circular arc to a point 54, and then lifts the front end 23 to a point 55 while feeding the wire from the front end 23. Furthermore, a third circular arc lifting step 63 is carried out which moves the front end 23 in a circular arc from the point 55 toward the second direction with a circular arc to a point 56, and then lifts the front end 23 to a point 57 while feeding the wire from the front end 23 (a circular arc lifting step).

By the three circular arc lifting steps 61-63, the control part moves the front end 23 by a distance L3 toward the second direction and lifts the front end 23 by the height H2 from the point 51 to the point 57. Here, the distance L3 is a distance of 50-70% of the height D2 of the wire loop 30, and the height H2 is a distance of 20-40% of the height D2 of the wire loop 30. In addition, a ratio of the distance L3 to the height D2 of the wire loop 30 is 50%, 55%, 60%, 65%, and 70% in particular, and may be within a range between any two of these ratios. Besides, a ratio of the height H2 to the height D2 of the wire loop 30 is 20%, 25%, 30%, 35%, and 40% in particular, and may be within a range between any two of these ratios. The three circular arc lifting steps 61-63 prevent the situation described before with reference to FIG. 3 in which the wire loop 30 leans toward the second direction or the first direction, or the situation described with reference to FIG. 4 in which the shape of the wire loop 30 bulges outward.

In addition, in the embodiment, the situation in which the control part carries out three circular arc lifting steps 61-63 is described; however, the front end 23 may also be moved by the distance L3 toward the second direction and be lifted by the height H2 from the point 51 to the point 57 by one or two circular arc lifting steps. Moreover, the control part may also move the front end 23 by the distance L3 toward the second direction and lift the front end 23 by the height H2 by more than four circular arc lifting steps.

Next, the control part moves the front end 23 in the circular arc from the point 57 to a point 58 toward the first direction by a distance (L3+L4) (the circular arc motion step). Here, the distance (L3+L4) is a distance of 110-130% of the height D2 of the wire loop 30. This operation defines a bending radius of the top 32 of the wire loop 30 shown in FIG. 1, the bending radius of top 32 decreases when the distance (L3+L4) increases, and the bending radius of top 32 increases when the distance (L3+L4) decreases. In addition, the point 58 becomes the top 32 the wire loop 30.

Next, the control part lifts the front end 23 from the point 58 to a point 59 by a height H3 while feeding the wire from the front end 23 (a second lifting step). The height H3 is a distance of 100-120% of the height D2 of the wire loop 30. In addition, a ratio of the height H3 to the height D2 of the wire loop 30 is 100%, 105%, 110%, 115%, and 120% in particular, and may be within a range between any two of these ratios. Besides, a height H4 of the point 59 from the surface of the substrate 10 is 160-210% of the height D2 of the wire loop 30. The height H4 is the second height. After that, the front end 23 is looped in a circular arc from the point 59 to the second position 14 (a looping step) for bonding the wire at the second position 14 and forming the second junction 17.

By carrying out the bonding with the method as mentioned above, the angle φ1 and the angle φ2 can be set to be smaller than the angle φ0. For this reason, the contact of the capillary 20 with the wire loop 30 during the bonding can be prevented. Accordingly, the wire loop 30 with increased height can be formed in a stable manner.

Next, another embodiment of the disclosure is described with reference to FIG. 6. The parts which are the same as described with reference to FIG. 1-5 are indicated by the same symbols and the description is omitted. In the embodiment described above, such a situation is described in which the wire loop 30 shown in FIG. 1 approximating the shape of an isosceles triangle with substantially equal angle φ1 and angle φ2 is formed; however, a kink 35 may be formed in the first sloping part 31 by increasing the distance L3 and the height H2 toward the first direction in the circular arc lifting step 61-63. The shape of the wire loop 30 can be stabilized by the kink 35.

Figure 6:
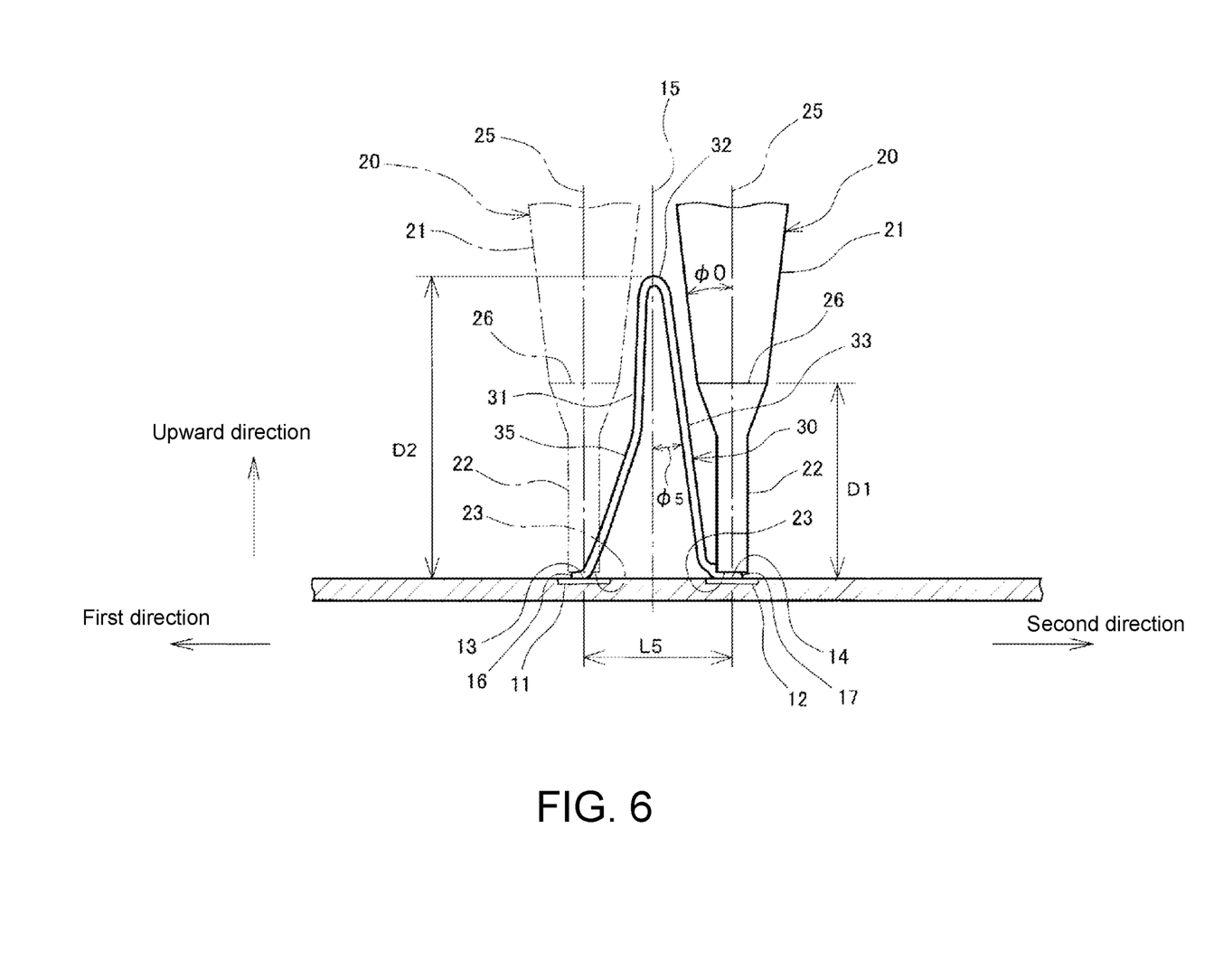
FIG. 6 is an elevation view showing a wire loop and a capillary bonded by a wire bonding method of another embodiment of the disclosure.

Furthermore, the bending radius of the top 32 may also be decreased by increasing the moving distance (L3+L4) from the point 57 to the point 58 and form a wire loop 30 with a pointed top 32 as shown in FIG. 6, so that an angle φ5 of the second sloping part 33 with respect to the imaginary perpendicular line 15 becomes greater than the angle φ2 of the second sloping part 33 described above with reference to FIG. 1. In this case, a difference between the angle φ5 and the angle φ0 of the elementary part 21 is greater than the embodiment described above with reference to FIGS. 1 and 2, and the contact with the second sloping part 33 of the wire loop 30 is even rarer.

The capillary 20 represented by the one-dot chain line in FIG. 6 represents the capillary 20 at the beginning of the formation of the wire loop 30. At this moment, the capillary 20 is located on the perpendicular surface including the wire loop 30. As shown in FIG. 6, even in this state, there is a gap between the surface of the elementary part 21 of the capillary 20 and the first sloping part 31. Because the first sloping part 31 of the adjacent wire loop 30, which is spaced apart by the pitch P and whose bonding is finished, and the surface of the elementary part 21 of the capillary 20 represented by the one-dot chain line in FIG. 6 are more separated than the situation shown in FIG. 1, thus at the beginning of the bonding of the wire loop 30, the capillary 20 does not contact with the adjacent wire loop 30 represented by the solid line whose bonding is finished.

According to the embodiment, the angle φ2 can be further increased. For this reason, at the end of the bonding, the surface of the capillary 20 can be prevented from contacting with the already bonded wire loop 30. Besides, by arranging the kink 35, at the beginning of the bonding, the surface of the capillary 20 can be more effectively prevented from contacting the adjacent wire loop 30 whose bonding is finished. Accordingly, the shape of the wire loop 30 with increased height can be formed in a more stable way.

The invention claimed is:

1. A manufacturing method of a semiconductor device, comprising:
    a first lifting step for bonding a wire at a first position on a substrate by a capillary and for lifting the capillary to a first height while feeding the wire from the capillary;
    a circular arc lifting step for carrying out a circular arc motion for moving the capillary in a circular arc in a direction toward a second position on the substrate that is spaced apart from the first position by a first distance, and then carrying out a lifting motion for lifting the capillary while feeding the wire from the capillary to apply a bending habit to the wire;
    a circular arc motion step for moving the capillary in a circular arc in a direction toward the first position by a second distance longer than the first distance;
    a second lifting step for lifting the capillary up to a second height higher than the first height while feeding the wire from the capillary; and
    a looping step for looping the capillary to the second position; wherein
    by bonding the wire at the second position, a wire loop having a predetermined height is formed on the substrate.

2. The manufacturing method of a semiconductor device according to claim 1, wherein
    the circular arc lifting step is carried out for several times.

3. The manufacturing method of a semiconductor device according to claim 1, wherein
    the capillary is a stepped cone shape having a tapered elementary part and a front part thinner than the elementary part;
    the wire loop is a mountain shape whose height from the substrate is higher than a length of the front part of the capillary, and an angle of a sloping part on the second position side of the wire loop with respect to an imaginary perpendicular line of the substrate is larger than a spread angle of an external surface of the elementary part with respect to a central axis of the capillary;
    the first height is 60-90% of the height of the wire loop;
    the first distance is 50-80% of the height of the wire loop;
    the second distance is 110-130% of the height of the wire loop; and
    the second height is 160-210% of the height of the wire loop.

* * * * *